(12) United States Patent
Pillarisetty et al.

(10) Patent No.: US 8,674,448 B2
(45) Date of Patent: Mar. 18, 2014

(54) TRIGATE STATIC RANDOM-ACCESS MEMORY WITH INDEPENDENT SOURCE AND DRAIN ENGINEERING, AND DEVICES MADE THEREFROM

(75) Inventors: Ravi Pillarisetty, Portland, OR (US); Willy Rachmady, Beaverton, OR (US); Brian S. Doyle, Portland, OR (US); Robert S. Chau, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/563,432

(22) Filed: Jul. 31, 2012

(65) Prior Publication Data

US 2012/0292709 A1    Nov. 22, 2012

Related U.S. Application Data

(62) Division of application No. 12/317,536, filed on Dec. 24, 2008, now Pat. No. 8,361,871.

(51) Int. Cl.
*H01L 21/70* (2006.01)

(52) U.S. Cl.
USPC .......... 257/368; 438/300; 257/E21.632; 257/E29.166

(58) Field of Classification Search
None
See application file for complete search history.

(56) References Cited

U.S. PATENT DOCUMENTS

| | | |
|---|---|---|
| 2005/0073060 A1 | 4/2005 | Datta et al. |
| 2005/0173740 A1 | 8/2005 | Jin |
| 2010/0155848 A1 | 6/2010 | Pillarisetty et al. |

FOREIGN PATENT DOCUMENTS

| | | |
|---|---|---|
| CN | 1890798 A | 1/2007 |
| CN | 1926672 A | 3/2007 |
| JP | 2007-509490 A | 4/2007 |
| JP | 2007-524240 A | 8/2007 |
| JP | 2008-090958 A | 4/2008 |
| KR | 10-2006-0035746 A | 4/2006 |
| KR | 10-2006-0071429 A | 6/2006 |
| KR | 10-0781538 B1 | 12/2007 |
| WO | 2005/036651 A1 | 4/2005 |
| WO | 2010/074973 A2 | 7/2010 |
| WO | 2010/074973 A3 | 10/2010 |

OTHER PUBLICATIONS

Office Action Received for Korean Patent Application No. 2011-7007714, Mailed on Jun. 22, 20122, 4 pages of English Translation.
International Search Report and Written Opinion Received for PCT Patent Application No. PCT/US2009/067281, Mailed on Jul. 14, 2010, 12 pages.
International Preliminary Report on Patentability Received for PCT Patent Application No. PCT/US2009/067281, Mailed on Jul. 7, 2011, 8 pages.
Office Action received for Chinese Patent Application No. 200980139208.9, mailed on Mar. 20, 2013, 9 pages of English translation and 8 pages of Office Action including 2 pages of Search Report.
Office Action received for Japanese Patent Application No. 2011-537749, mailed on Apr. 23, 2013, 4 pages of English translation and 4 pages of Office Action.

*Primary Examiner* — Sonya D McCall Shepard
(74) *Attorney, Agent, or Firm* — Winkle, PLLC (57) ABSTRACT

A static random-access memory circuit includes at least one access device including source and drain sections for a pass region, at least one pull-up device and at least one pull-down device including source-and-drain sections for a pull-down region. The static random-access memory circuit is configured with external resistivity ($R_{ext}$) for the pull-down region to be lower than $R_{ext}$ for the pass region. Processes of achieving the static random-access memory circuit include source-and-drain epitaxy.

12 Claims, 9 Drawing Sheets

TRIGATE STATIC RANDOM-ACCESS MEMORY WITH INDEPENDENT SOURCE AND DRAIN ENGINEERING, AND DEVICES MADE THEREFROM

RELATED APPLICATIONS

The present application is a Divisional of U.S. application Ser. No. 12/317,536 filed Dec. 24, 2008, entitled "TRIGATE STATIC RANDOM-ACCESS MEMORY WITH INDEPENDENT SOURCE AND DRAIN ENGINEERING, AND DEVICES MADE THEREFROM"

TECHNICAL FIELD

Disclosed embodiments relate to semiconductor memory devices and processes of making them.

BACKGROUND

As integrated circuit semiconductor technology continues to scale to smaller geometries, intrinsic threshold voltage (Vt) variations in minimum geometry size affect quality. For example, the static noise margin (SNM) in a complementary metal-oxide semiconductor (CMOS) static random-access memory (SRAM) cell can be adversely affected by intrinsic Vt variations. This reduction in SNM caused by increasingly smaller transistor geometries can cause difficulties. SNM is further reduced when Vcc is scaled to a lower voltage.

The Vt variations pose barriers to the scaling of supply voltage, transistor size, and, hence, the minimum six transistor (6T) CMOS SRAM cell size. These barriers limit the total transistor yield for conventional 6T SRAM-dominated high performance CMOS devices such as application-specific integrated circuits (ASICs) and microprocessors due to die size and cost constraints.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings may only show the structures necessary to understand the illustrated embodiments. Additional structures known in the art may not have been included to maintain the clarity of the drawings. Although a processor chip and a memory chip may be mentioned in the same sentence, it should not be construed that they are equivalent structures.

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" may be understood by reference to the X-Z coordinates, and terms such as "adjacent" may be understood by reference to the illustrated X-Y coordinates.

Figure 1:
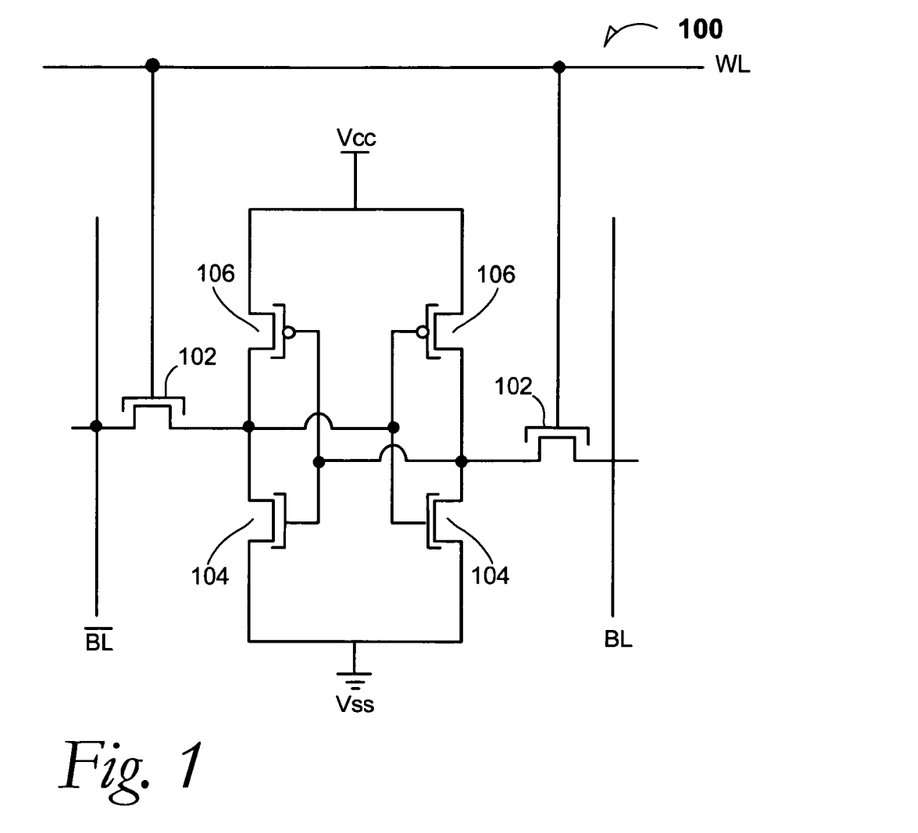
FIG. 1 is an illustration of a six-transistor CMOS SRAM circuit diagram with tri-gate transistors according to according to an embodiment.
Figure 2:
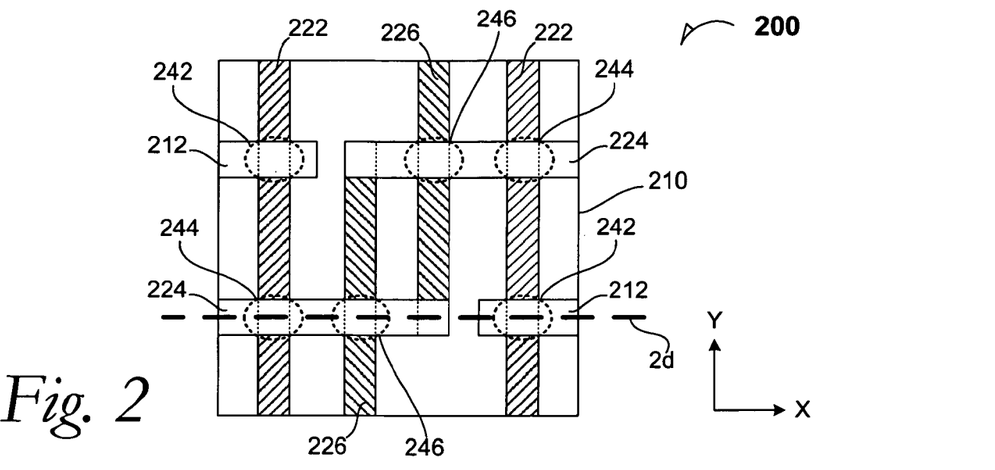
FIG. 2 is a top plan of a 6T CMOS SRAM cell layout according to an example embodiment.

FIG. 1 is an illustration of a 6T CMOS SRAM circuit diagram 100 with tri-gate transistors according to according to an embodiment. The SRAM cell illustrates a 6T CMOS SRAM cell circuit diagram using tri-gate transistors according to an embodiment. The SRAM cell includes two N-type access devices, 102, two N-type pull-down devices, 104, and two P-type pull-up devices, 106. The access devices may also be referred to as pass devices as they are word-line transistors to allow bit-line data or operations to pass into the pull-down and pull-up devices. In an embodiment, each of the N-type access devices 102 includes a single-fin tri-gate transistor with an independent source-and-drain (S/D) section. In an embodiment, each of the P-type pull-up devices 106 is a single-fin tri-gate transistor. And in an embodiment, each of the N-type pull-down devices 104 is a single-fin tri-gate transistor with an independent S/D section. Using independent S/D sections allows a circuit designer to achieve a higher cell ratio for the SRAM cell. The independent S/D sections in the access- and pull-down devices can deliver more current, thus increasing the cell ratio without increasing the cell layout size FIG. 2 is a top plan of a 6T CMOS SRAM cell layout according to an example embodiment. In an embodiment, the cell layout is asymmetrical where the access devices 242 are configured on diagonals to each other as illustrated by the X-Y coordinates, as well as the pull-down devices 244 and also the pull-up devices 246. The gate of each access device is located in region 242 (two occurrences) above a semiconductive substrate 210. Each of the access devices 242 will include independent S/D sections with further processing set forth herein. The gate of each pull-down device 244 is located in a region 244 (two occurrences) above the semiconductive substrate 210. Each of the pull-down devices 244 will include independent S/D sections with further processing set forth herein. The gate of each pull-up device 246 is located in the region 246 above the semiconductive substrate 210.

With respect to the access devices 242, the region 242 is indicated by polysilicon films 212 that are disposed over N-type diffusions 222. With respect to the pull-down devices 244, the region 244 is indicated by polysilicon films 224 at a location where they are disposed over the N-type diffusions 222. And with respect to the pull-up devices 246, the regions 246 are indicated by the polysilicon films 224 at a location where they are disposed over P-type diffusions 226.

Completion of the cell layout may be done with metal layers that can provide power (Vcc) and ground (Vss) connections as seen in FIG. 1. Metal layers can also connect the gate/source/drain of one tri-gate transistor in the SRAM cell to the gate/source/drain of another tri-gate transistor in the SRAM cell. Other metal layers can connect a first SRAM cell embodiment to second SRAM cell embodiment.

As described herein, the use of an N-type tri-gate device as the pull-down device 244 that may have independent S/D sections and an N-type tri-gate device as the access device 242 that also may have independent S/D sections allows a tri-gate SRAM cell to be designed having a higher cell ratio in the same layout area as a planar SRAM cell.

Figure 2A:
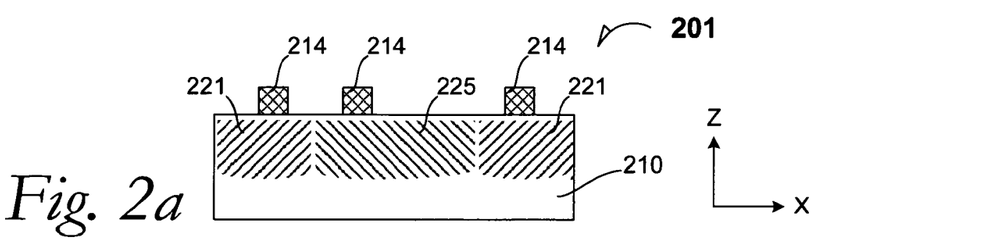
FIG. 2a is a cross-section elevation of the SRAM cell layout depicted in FIG. 2 during preliminary processing according to an example embodiment.

FIG. 2a is a cross-section elevation of the SRAM cell layout depicted in FIG. 2 during preliminary processing according to an example embodiment. The SRAM cell 201 is depicted with the semiconductive substrate 210. Two N-type precursor diffusions 221 are depicted in the semiconductive substrate 210 as well as a P-type precursor diffusion 225. Processing is advanced by depositing and patterning a mask 214 in preparation for forming semiconductive fins that will support tri-gate structures.

Figure 2B:
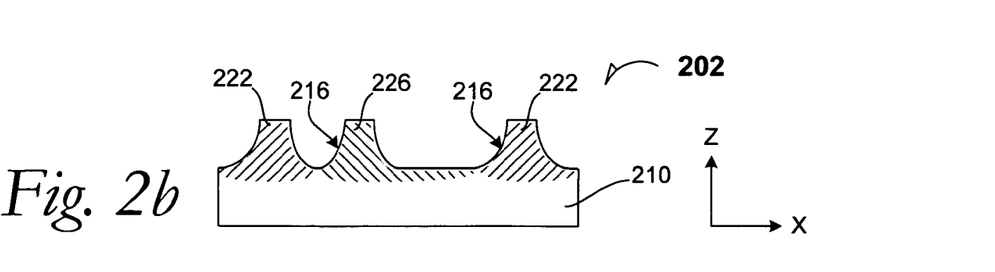
FIG. 2b is a cross-section elevation of the SRAM cell layout depicted in FIG. 2a after further processing according to an embodiment.

FIG. 2b is a cross-section elevation of the SRAM cell layout depicted in FIG. 2a after further processing according to an embodiment. The SRAM cell 202 is depicted after etching past the mask 214 (FIG. 2a) to form recesses 216 to leave fin-shaped diffusions that extend in the Z-dimension. As depicted two fin-shaped N-type diffusions 222 have been formed from the two N-type precursor diffusions 221 depicted in FIG. 2a. Similarly, a fin-shaped P-type diffusion 226 has been formed from the P-type precursor diffusion 225.

Figure 2C:
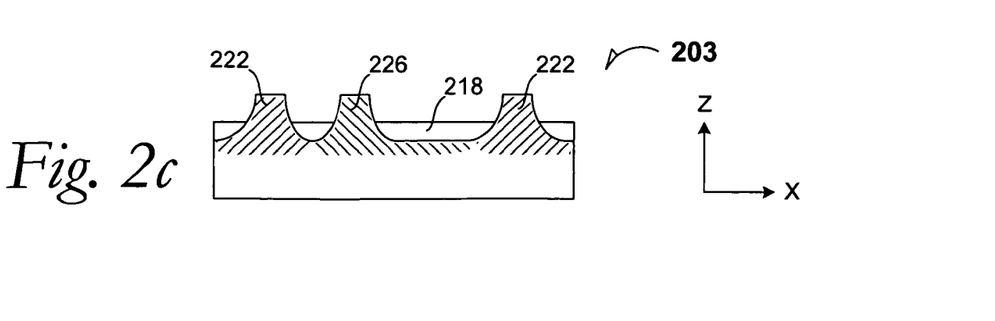
FIG. 2c is a cross-section elevation of the SRAM cell layout depicted in FIG. 2b after further processing according to an embodiment.

FIG. 2c is a cross-section elevation of the SRAM cell layout depicted in FIG. 2b after further processing according to an embodiment. The SRAM cell 203 is depicted after the formation of shallow-trench isolation (STI) structures 218. In an embodiment a dielectric material is blanket deposited, polished, and etched back to achieve the STI structure 218 that expose the fin-shaped diffusions 222 and 226. In an embodiment, the dielectric material is silica ($SiO_2$).

Figure 2D:
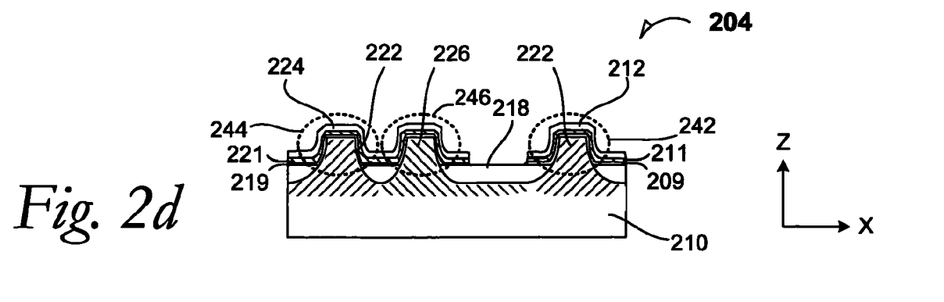
FIG. 2d is a cross-section elevation of the SRAM cell layout depicted in FIG. 2c after further processing according to an example embodiment.

FIG. 2d is a cross-section elevation of the SRAM cell layout depicted in FIG. 2c after further processing according to an example embodiment. The cross-section is taken along the section line 2d seen in FIG. 2. The SRAM cell 204 is processed for the formation of transistors by depositing a polysilicon film and patterning it as the polysilicon film 212 that is disposed over the N-type diffusion 222 at an access (also referred to as pass gate) region 242 in a tri-gate configuration. A gate dielectric layer 209 and a metal gate electrode 211 are disposed below the polysilicon film 212 and the three structures are patterned together. In an embodiment, the gate dielectric layer 209 is a high-k material such as hafnium oxide $HfO_2$. In an embodiment, the gate dielectric layer 209 is a high-k material such as zirconium oxide ($ZrO_2$). In an embodiment, the gate dielectric layer 209 is a high-k material such as aluminum oxide ($Al_2O_3$). In an embodiment, the gate dielectric layer 209 is a high-k material such as silicon dioxide ($SiO_2$) The metal gate electrode 211 is a material such as titanium nitride (TiN). In an embodiment, the metal gate electrode 211 is a material such as tantalum nitride (TaN). In an embodiment, the metal gate electrode 211 is a material such as aluminum (Al). Other metals may be used according to a specific useful application.

The formation of transistors is further processed by patterning the polysilicon film 224 that is disposed over the N-type diffusion 222 at a pull-down region 244. The polysilicon film 224 is also disposed over the P-type diffusion 226 at a pull-up region 246 in a tri-gate configuration A gate dielectric layer 219 and a metal gate electrode 221 are disposed below the polysilicon film 224.

Figure 2E:
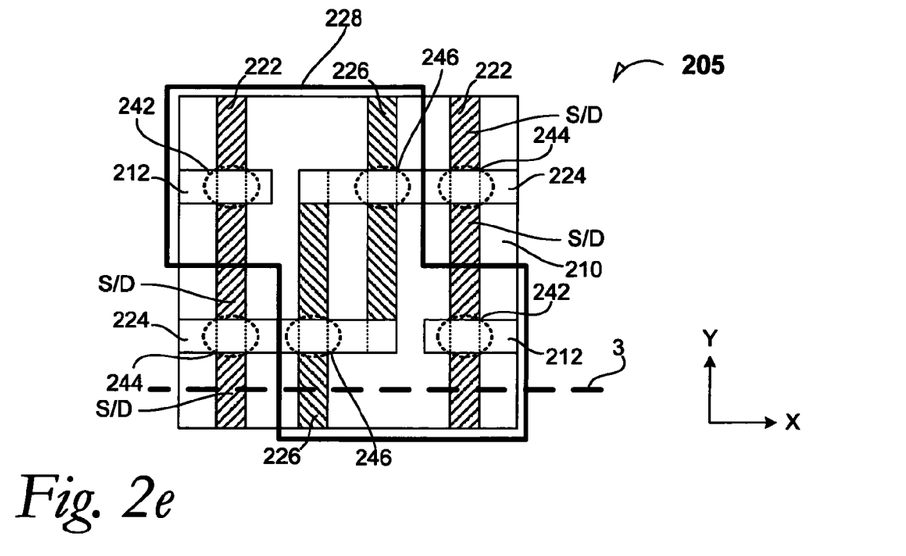
FIG. 2e is a top plan of the SRAM cell layout depicted in FIG. 2d after further processing according to an embodiment.

FIG. 2e is a top plan of the SRAM cell layout depicted in FIG. 2d after further processing according to an embodiment. The SRAM cell 205 is depicted with a first blocking mask 228 that protects pull-up regions 246 as well as access regions 242 during processing. The first blocking mask 228 is depicted only in footprint outline to illustrate that it principally protects the pull-up regions 246 and the access regions 242, but leaves exposed S/D sections for the pull-down regions 244 in order to achieve independent S/D sections.

Figure 3:
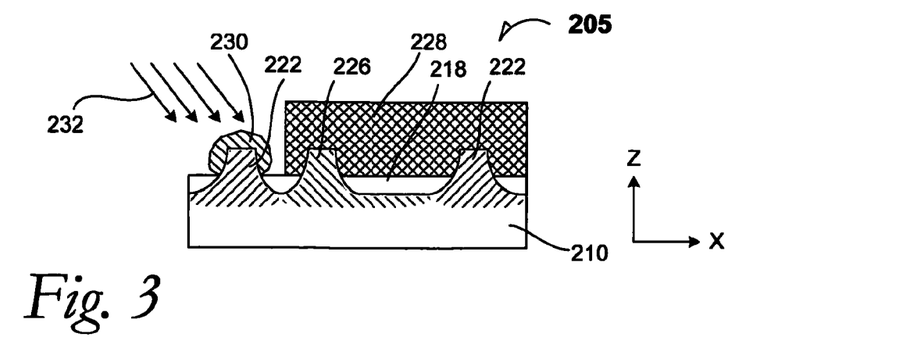
FIG. 3 is a cross-section elevation of the SRAM cell layout depicted in FIG. 2e after further processing according to an embodiment.

FIG. 3 is a cross-section elevation of the SRAM cell layout depicted in FIG. 2e during processing according to an embodiment. The cross-section elevation is taken along the section line 3 depicted in FIG. 2e. The first blocking mask 228 is shown protecting the fin-shaped P-type diffusion 226 as well as the fin-shaped N-type diffusion 222 that is supports the access regions 242 (FIG. 2e).

In a processing embodiment, a first epitaxial film 230 is grown on the fin-shaped N-type diffusion 222 that is exposed through the blocking mask 228 and that is part of a pull-down region 244. In an embodiment, the first epitaxial film 230 is first grown, followed by implantation 232 of dopant to enhance the S/D structure with respect to both S/D bulk and S/D doping. In an embodiment, the first epitaxial film 230 is silicon that is deposited by a silane process. In an embodiment, the first epitaxial film 230 is grown with in situ doping that achieves an independent S/D structure with respect to both S/D bulk and S/D doping. In an embodiment, the first epitaxial film 230 is grown without either of implantation 232 or in situ doping.

Figure 2F:
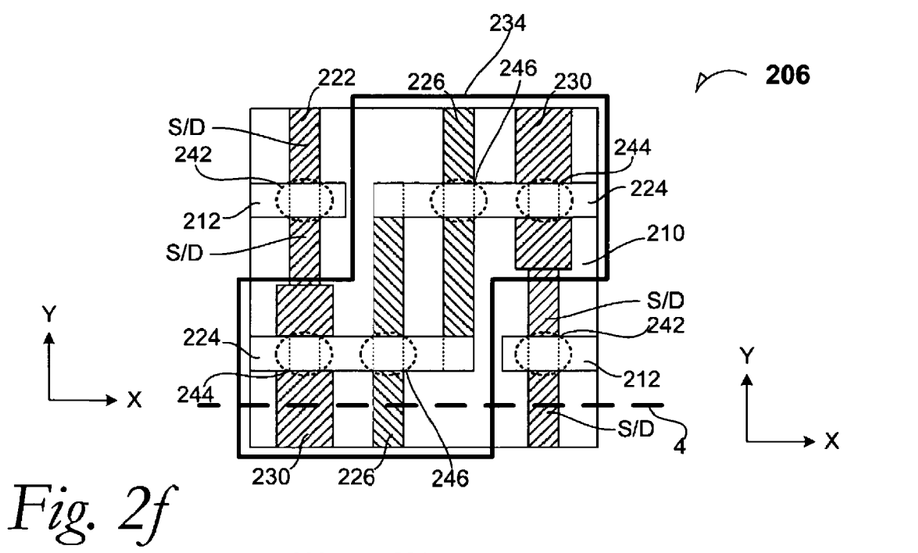
FIG. 2f is a top plan of the SRAM cell layout depicted in FIG. 3 after further processing according to an embodiment.

FIG. 2*f* is a top plan of the SRAM cell layout depicted in FIG. 3 after further processing according to an embodiment. The SRAM cell 206 is depicted with a second blocking mask 234 that protects pull-up regions 246 as well as pull-down regions 242 during processing. The second blocking mask 234 is depicted only in footprint outline to illustrate that it principally protects the pull-up regions 246 and the pull-down regions 244, but leaves exposed S/D sections for the access regions 242 in order to achieve independent S/D sections.

Figure 4:
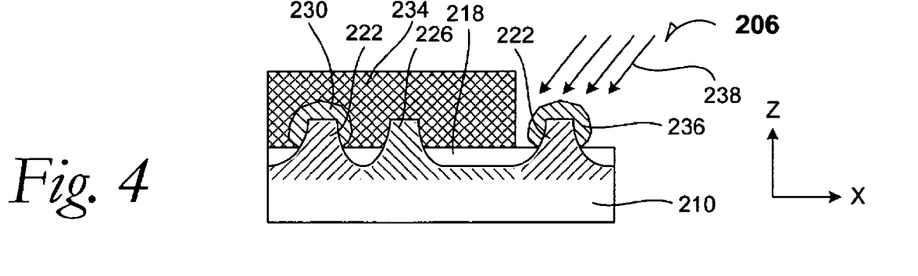
FIG. 4 is a cross-section elevation of the SRAM cell layout depicted in FIG. 2f during processing according to an embodiment.

FIG. 4 is a cross-section elevation of the SRAM cell layout depicted in FIG. 2*f* during processing according to an embodiment. The cross-section elevation is taken along the section line 4 depicted in FIG. 2*f*. The second blocking mask 234 is shown protecting the fin-shaped P-type diffusion 226 as well as the fin-shaped N-type diffusion 222 that is part of the pull-down regions 242 (FIG. 2*f*).

In a processing embodiment, a second epitaxial film 236 is grown on the fin-shaped N-type diffusion 222 that is exposed through the second blocking mask 234 and that is part of an access region 242. In an embodiment, the second epitaxial film 236 is first grown, followed by implantation 238 of dopant to enhance the S/D structure with respect to both S/D bulk and S/D doping. In an embodiment, the second epitaxial film 236 is grown with in situ doping that achieves an independent S/D structure with respect to both S/D bulk and S/D doping. In an embodiment, only the second epitaxial film 236 is grown without either of implantation 232 or in situ doping.

The first epitaxial film 230 may also be referred to as the epitaxial pull-down S/D film 230. Similarly, the second epitaxial film 236 may also be referred to as the epitaxial access S/D film 236.

It can now be understood that S/D section enhancement of a pull-down region over that of a S/D section access region in an SRAM may be done by having at least one occurrence of epitaxy such as only at the S/D section of the pull-down region. As a consequence the beta ratio, defined as overall conductivity of a pull-down over that of an access, is improved by achieving a lower external resistivity ($R_{ext}$) of the pull-down than that of the access.

Figure 2G:
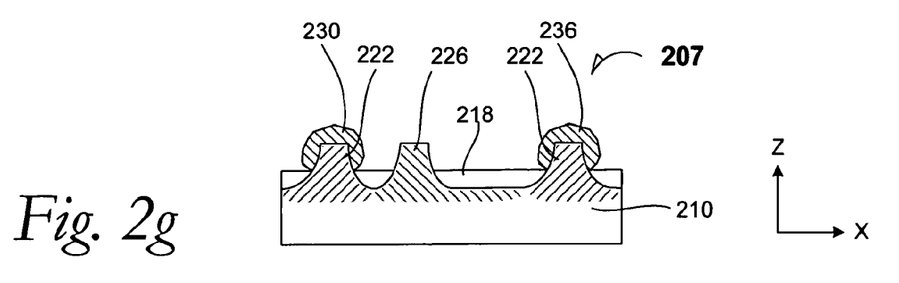
FIG. 2g is a cross-section elevation of the SRAM cell layout depicted in FIG. 4 after further processing according to an example embodiment.

FIG. 2*g* is a cross-section elevation of the SRAM cell layout depicted in FIG. 4 after further processing according to an example embodiment. The SRAM cell 207 has been further processed by stripping away the second blocking mask 234. The first epitaxial film 230 is disposed above and on the N-type diffusion 222 that is part of the pull-down regions 244. The second epitaxial film 236 is exposed above and on the N-type diffusion 222 that is part of the access regions 242.

In an embodiment, doping between the first epitaxial film 230 and the second epitaxial film 236 is differentiated. Doping differentiation is useful to change behavior of the SRAM cell. In an embodiment, epitaxial film doping is carried out to make the transistors contained in the pull-down 244 regions to have a lower $R_{ext}$ than the transistors contained in the access regions 242. In a process embodiment, the epitaxial-film volumetric size that support pull-down regions 244 is different than the epitaxial-film size that support the access regions 242, such that $R_{ext}$ of the pull-down regions 244 is lower than $R_{ext}$ of the access regions 242. In a process embodiment, the doping of the S/D sections in the pull-down regions 244 is different than that of the S/D sections in the access regions 242, such that $R_{ext}$ of the pull-down regions 244 is lower than $R_{ext}$ of the access regions 242.

In an embodiment, doping of the fin-shaped N-type diffusion 222 that is part of the pull-down regions 242 is done by first implanting the N-type diffusion 222 with N-type dopant in a range from $1\times10^{19}$ cm$^{-3}$ to $5\times10^{19}$ cm$^{-3}$. During processing, the epitaxial sections such as the first epitaxial film 230 and the second epitaxial film 236 are doped in a range from $1\times10^{20}$ cm$^{-3}$ to $1\times10^{22}$ cm$^{-3}$, and doping differentials are achieved in the epitaxial films to allow the $R_{ext}$ of the pull-down to be lower than $R_{ext}$ of the access.

In an embodiment, the fin-shaped N-type diffusion 222 is implanted with N-type dopant in a range from $1\times10^{19}$ cm$^{-3}$ to $5\times10^{19}$ cm$^{-3}$, doping of the first epitaxial film 230 is in a range from $1\times10^{20}$ cm$^{-3}$ to $5\times10^{20}$ cm$^{-3}$, and doping of the second epitaxial film 236 is in a range from $1\times10^{21}$ cm$^{-3}$ to $1\times10^{22}$ cm$^{-3}$.

It can now be understood that a combination of volumetric size and doping differential may be carried out such that a useful configuration achieves the $R_{ext}$ of the pull-down lower than $R_{ext}$ of the access. In an embodiment, volumetric size is differentiated to achieve this useful configuration. In an embodiment, volumetric size is substantially equal between access S/D epitaxy and pull-down S/D epitaxy, but doping is differentiated to achieve this useful configuration. In an embodiment, both volumetric size and doping are differentiated between access S/D epitaxy 236 and pull-down S/D epitaxy 230 to achieve this useful configuration.

In an embodiment, a differentiation can be achieved by using in situ doping for at least one of the access S/D epitaxy 236 and the pull-down S/D epitaxy 230. In an example embodiment, the access S/D epitaxy 236 is implanted after epitaxial growth, but the pull-down S/D epitaxy 230 is in situ doped during epitaxial growth. In an example embodiment, the pull-down S/D epitaxy 230 is implanted after epitaxial growth, but the access S/D epitaxy 236 is in situ doped during epitaxial growth.

It can now be appreciated that an SRAM cell may be constructed according to techniques set forth in this disclosure, where at least one of the pull-down and access devices includes a non-planar configuration. Typically, all of the diffusions may be fin-shaped, but all need not be according to the several embodiments.

Figure 5:
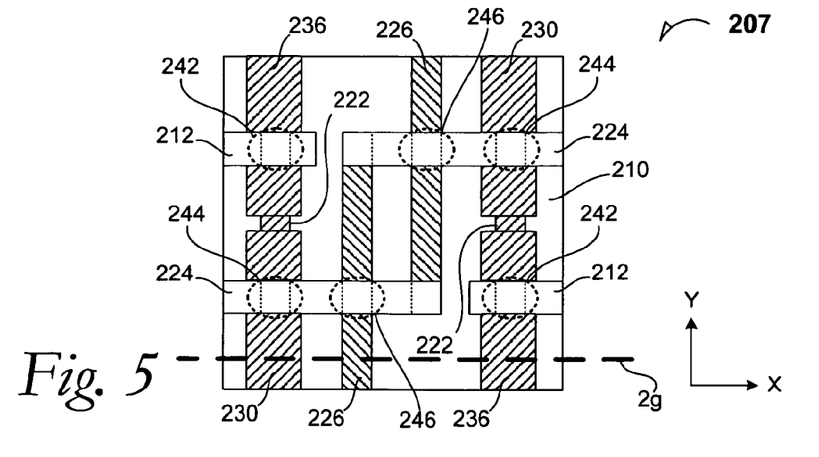
FIG. 5 is a top plan of the SRAM cell layout according to an example embodiment.

FIG. 5 is a top plan of the SRAM cell layout depicted in FIG. 2*g* according to an embodiment. The SRAM cell 207 is depicted with independent S/D sections 230 and 236. It can be seen that an epitaxial growth embodiment is displayed.

Figure 6:
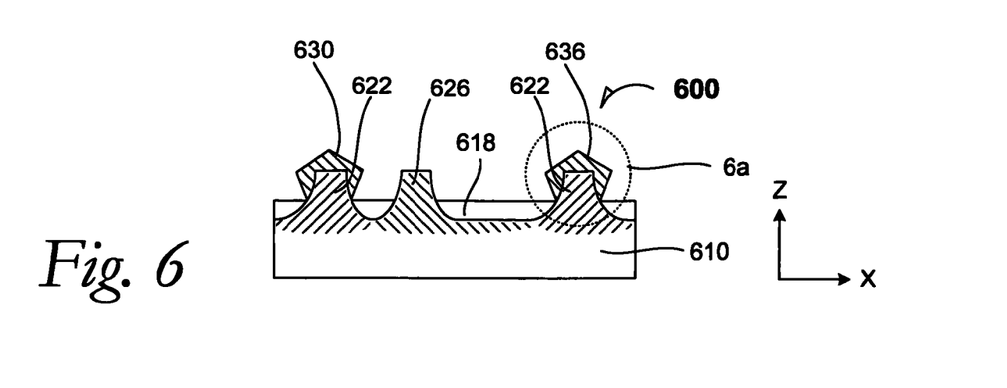
FIG. 6 is a cross-section elevation of an SRAM cell layout according to an example embodiment.

FIG. 6 is a cross-section elevation of an SRAM cell layout according to an example embodiment. The SRAM cell 600 is similar to the SRAM cell 207 depicted in 2*g*, except processing conditions causes the shape of epitaxial films 630 and 636 to be unique. The epitaxial films 630 and 636 show a quasi-diamond outline when seen in this cross section. Other illustrated structures include a semiconductive substrate 610, an STI structure 618, fin-shaped N-type diffusions 622, and a P-type diffusion 626.

Figure 6A:
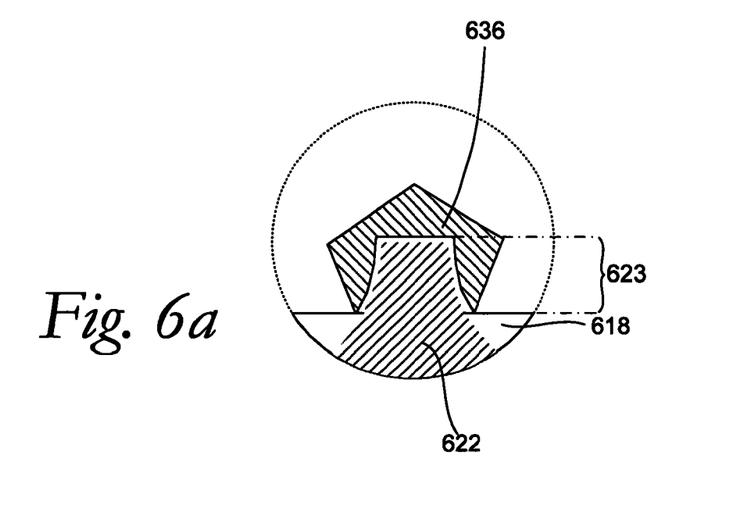
FIG. 6a is a detail section taken from the section 6a depicted in FIG. 6.

FIG. 6*a* is a detail section taken from the section 6*a* depicted in FIG. 6. In an embodiment, quantification of the epitaxial-film can be defined as a ratio between epitaxial film volume, divided by fin volume 623 that extends above the STI. As seen specific to FIG. 6*a*, the fin volume 623 that extends above the STI 618 is a portion of the N-type diffusion 622. This metric of fin volume 623 that extends above the STI 618, is divided by epitaxy volume 636 may be referred to as "epitaxy height" or "tallness" of the epitaxy 636.

In an embodiment, epitaxy height is less than one. In an embodiment, epitaxy height is equal to one. In an embodiment, epitaxy height is in a range from 1 to 4. In an embodiment, epitaxy height is about 2. In an embodiment, epitaxy height is about 3. In an embodiment, epitaxy height is in a range from 3 to 4.

Figure 7:
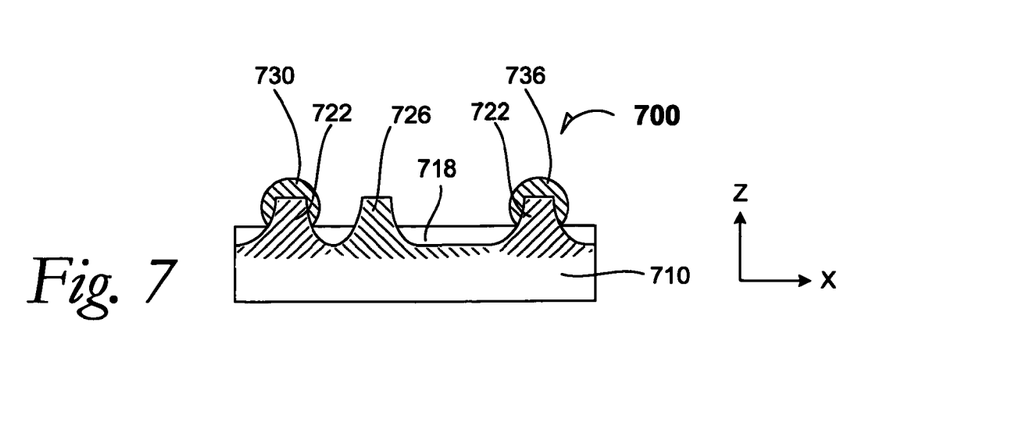
FIG. 7 is a cross-section elevation of an SRAM cell layout according to an example embodiment.

FIG. 7 is a cross-section elevation of an SRAM cell according to an example embodiment. The SRAM cell 700 is similar to the SRAM cells 207 and 600, except processing conditions causes the shape of epitaxial films 730 and 736 to be unique. The epitaxial films 730 and 736 show a quasi-circular outline when seen in this cross section. Other structures include a semiconductive substrate 710, an STI structure 718, fin-shaped N-type diffusions 722, and a fin-shaped P-type diffusion 726.

Where the epitaxy 730 and 736 may have a substantially circular profile, it can now be seen that epitaxy height for the epitaxial films may also be quantified by comparing diffusion volume to epitaxy volume.

Figure 8A:
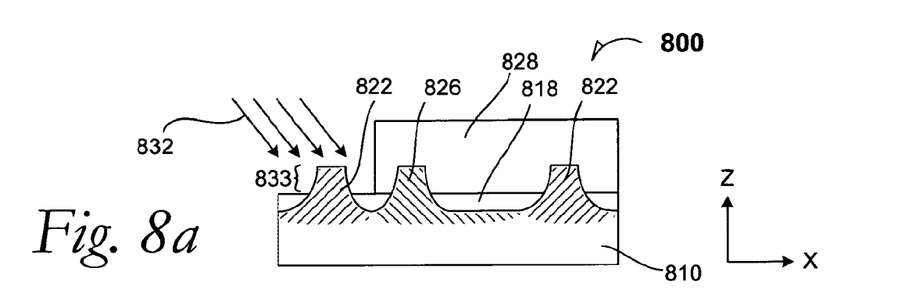
FIG. 8a is a cross-section elevation of an SRAM cell layout during processing according to an example embodiment.

FIG. 8a is a cross-section elevation of an SRAM cell 800 during processing according to an example embodiment. The cross-section elevation may be taken along the section line 3 depicted in FIG. 2e. A first blocking mask 828 is shown protecting a fin-shaped P-type diffusion 826 as well as a fin-shaped N-type diffusion 822 that is adjacent an access region.

In a processing implantation 832 of dopant is carried out into the fin-shaped N-type diffusion 822 that is exposed through the first blocking mask 828. This implantation 832 enhances the S/D section with respect to S/D doping. An access enrichment region 833 is formed that is differently doped than the bulk of the N-type diffusion 822 that is shielded by the STI 818.

Figure 8B:
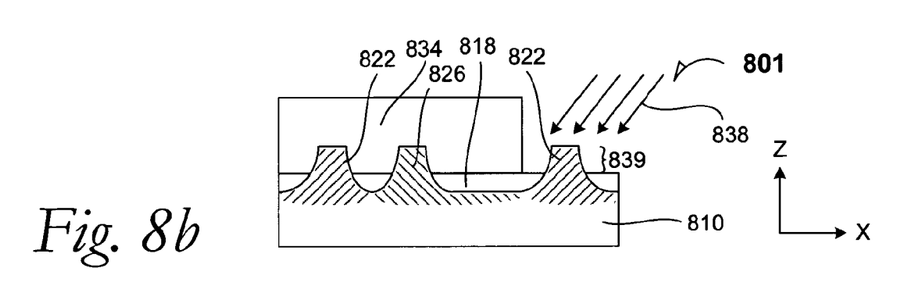
FIG. 8b is a cross-section elevation of the SRAM cell layout depicted in FIG. 8a after further processing according to an embodiment.

FIG. 8b is a cross-section elevation of the SRAM cell layout depicted in FIG. 8a after further processing according to an embodiment. The SRAM cell 801 is seen in cross-section elevation by a section line that is in the same position as the section line 3 depicted in FIG. 2e. The second blocking mask 834 is shown protecting the fin-shaped P-type diffusion 826 as well as the fin-shaped N-type diffusion 822 that is adjacent a pull-down region.

In a processing embodiment, implantation 838 of dopant is carried out to enhance the S/D structure with respect to both S/D bulk and S/D doping. A pull-down enrichment region 838 is formed that is differently doped than the bulk of the N-type diffusion 822 that is shielded by the STI 818.

It can now be appreciated that S/D section enhancement as depicted in FIGS. 8a and 8b may be carried out with or without epitaxy. In an embodiment, doping differentiation follows that of the epitaxial doping differentiation embodiments set forth above for the SRAM layout depicted in FIGS. 2g and 5.

Figure 9:
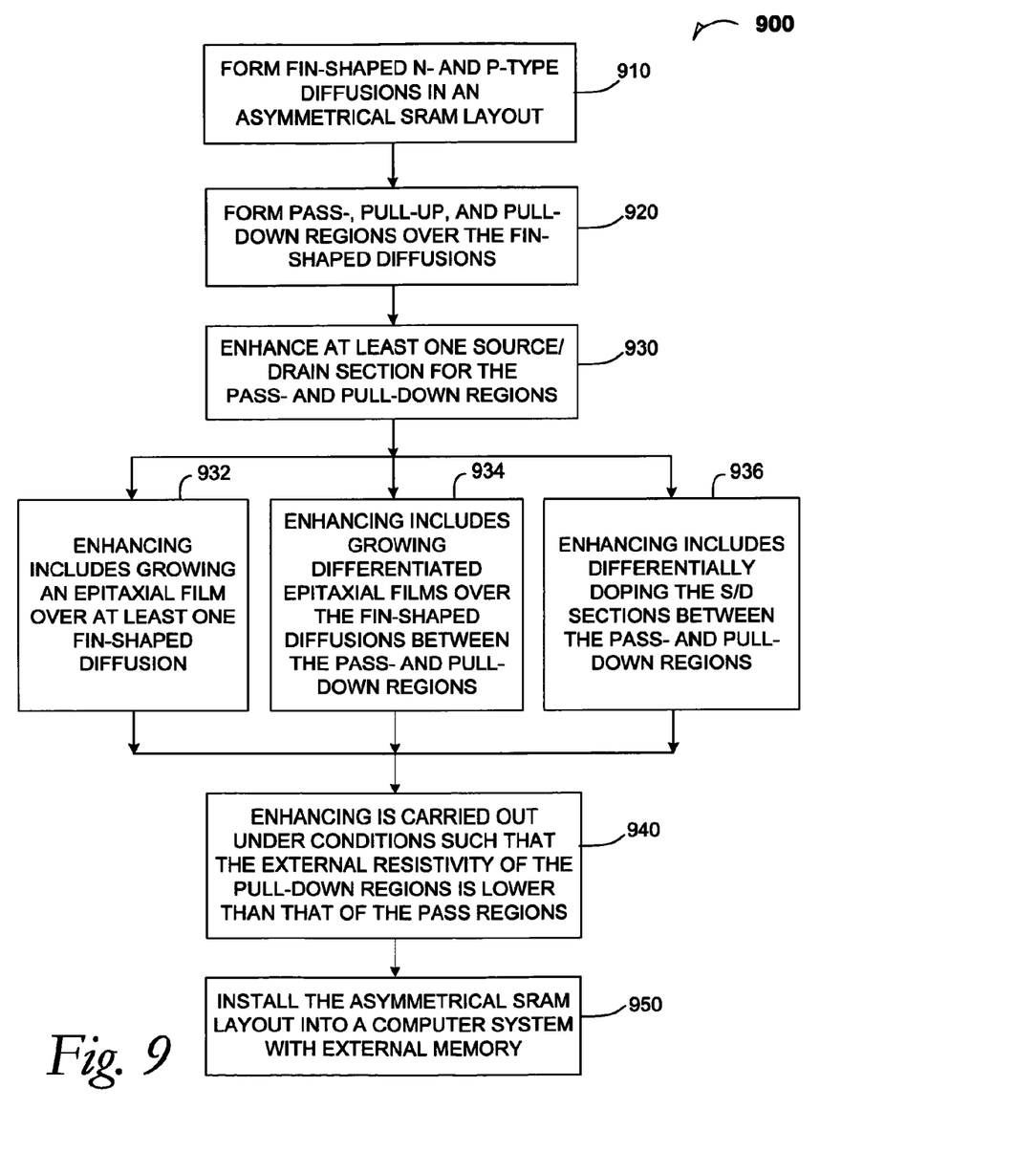
FIG. 9 is a process flow diagram according to an example embodiment.

FIG. 9 is a process flow diagram 900 according to an example embodiment. At 910, the process includes forming fin-shaped N- and P-type diffusions in an SRAM layout. In a non-limiting example embodiment, less than all of the diffusions are fin-shaped, but that at least one is a non-planar diffusion.

At 920, the process includes forming pass-, pull-up, and pull-down regions over the fin-shaped diffusions. In a non-limiting example embodiment, less than all of the diffusions are fin-shaped, but that at least one is a non-planar diffusion.

At 930, the process includes enhancing at least one S/D section for the pass- and pull-down regions.

At 932, the process at 930 is modified where enhancing includes growing an epitaxial film over at least one fin-shaped diffusion. In a non-limiting example, epitaxy is grown over only the S/D sections of the pass-regions such that the pull-down regions have a lower $R_{ext}$ than that of the pass regions.

At 934, the process at 930 is modified where enhancing includes growing differentiated epitaxial films over the fin-shaped diffusions, where the differentiation is between epitaxy over the S/D sections of the pass regions and the pull-down regions such that the pull-down regions have a lower $R_{ext}$ than that of the pass regions.

At 936, the process at 930 is modified where enhancing includes differentially doping the S/D sections, where the differentiation is between doping at the S/D sections of the pass regions and doping at the S/D sections of the pull-down regions, such that the pull-down regions have a lower $R_{ext}$ than that of the pass regions.

It can now be understood by the disclosure as set forth in the text and as illustrated in FIG. 9 that combinations of the processes 932, 934, and 936 may be carried out such that the pull-down regions have a lower $R_{ext}$ than that of the pass regions. At 940, the process is represented in summary such that enhancing is carried out under conditions such that the pull-down regions have a lower $R_{ext}$ than that of the pass regions. In an embodiment, the process commences at 910 and terminates at 940 where from one to all of processes 932, 934, and 936 are included.

In a method embodiment depicted at 950, an SRAM layout embodiment is installed into a computer system.

Figure 10:
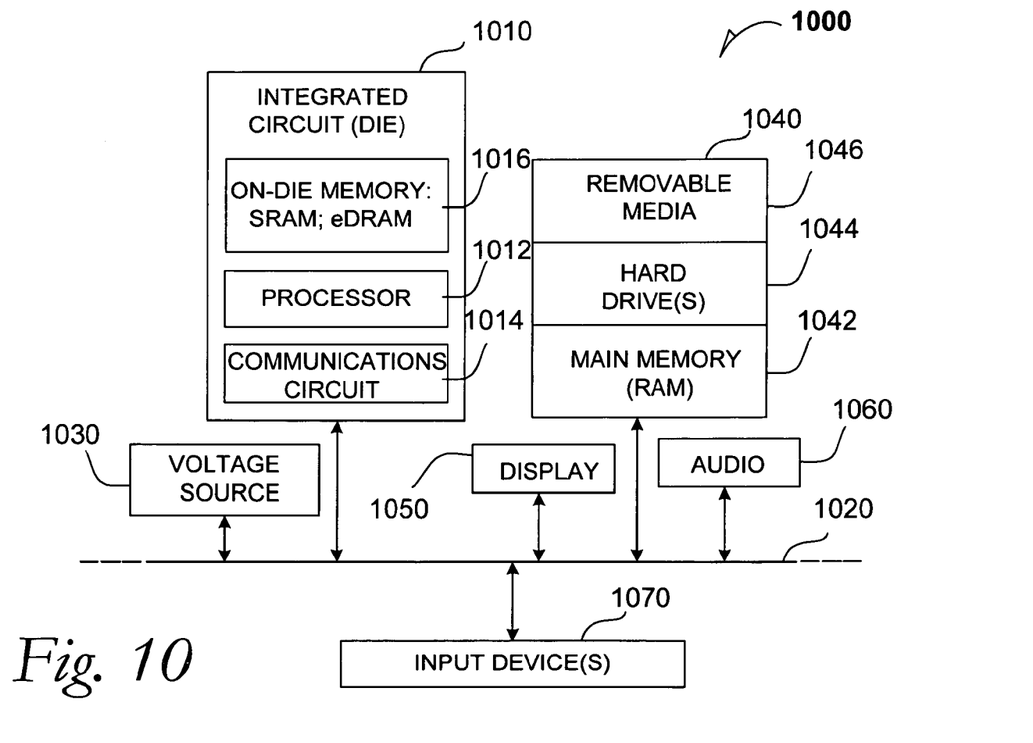
FIG. 10 is a schematic of an electronic system according to an embodiment.

FIG. 10 is a schematic of a computer system according to an embodiment.

The computer system 1000 (also referred to as the electronic system 1000) as depicted can embody an 6T SRAM cell with independent S/D access and pull-down sections such that the pull-down regions have a lower $R_{ext}$ than that of the pass regions according to any of the several disclosed embodiments and their equivalents as set forth in this disclosure. In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, pagers, portable computers, two-way radios, and similar electronic systems. In an embodiment, the processor 1010 includes on-die memory 1016 such as static random-access memory (SRAM) and the SRAM may include a 6T SRAM cell with independent S/D sections of the access and pull-down regions. In an embodiment, the processor 1010 includes embedded on-die memory 1016 such as embedded dynamic random-access memory (eDRAM).

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory keys, and other removable media known in the art.

In an embodiment, the electronic system 1000 also includes a display device 1050, an audio output 1060. In an embodiment, the electronic system 1000 includes a controller 1070, such as a keyboard, mouse, trackball, game controller, microphone, voice-recognition device, or any other device that inputs information into the electronic system 1000.

As shown herein, the integrated circuit 1010 can be implemented in a number of different embodiments, including an 6T SRAM cell with independent S/D access and pull-down sections according to any of the several disclosed embodiments and their equivalents, an electronic system, a computer system, one or more methods of fabricating an integrated circuit, and one or more methods of fabricating an electronic assembly that includes an 6T SRAM cell with independent S/D access and pull-down sections according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for an 6T SRAM cell with independent S/D access and pull-down sections according to any of the several disclosed embodiments and their equivalents.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A static random-access memory circuit, comprising:
   at least one access device including source and drain (S/D) sections for a pass region;
   at least one pull-up device; and
   at least one pull-down device including S/D sections for a pull-down region, wherein external resistivity ($R_{ext}$) for the pull-down region is lower than $R_{ext}$ for the pass region, and wherein at least one of S/D sections for the pass regions and S/D sections for the pull-down regions includes differentiated epitaxial volumetric amounts between the S/D sections for the pass regions and S/D sections for the pull-down regions.

2. The memory circuit of claim 1, wherein at least one of the pull-down and access devices includes a non-planar configuration.

3. A computing system, comprising:
   a die including a static random-access memory circuit, comprising:
      at least one access device including source and drain (S/D) sections for a pass region;
      at least one pull-up device; and
      at least one pull-down device including S/D sections for a pull-down region,
   wherein external resistivity ($R_{ext}$) for the pull-down region is lower than $R_{ext}$ for the pass region, and wherein at least one of S/D sections for the pass regions and S/D sections for the pull-down regions includes differentiated epitaxial volumetric amounts between the S/D sections for the pass regions and S/D sections for the pull-down regions; and
   external memory coupled to the microelectronic die.

4. The computing system of claim 3, wherein the computing system is part of one of a cellular telephone, a pager, a portable computer, a desktop computer, and a two-way radio.

5. A static random-access memory circuit, comprising:
   at least one access device including source and drain (S/D) sections for a pass region;
   at least one pull-up device; and
   at least one pull-down device including S/D sections for a pull-down region, wherein external resistivity ($R_{ext}$) for the pull-down region is lower than $R_{ext}$ for the pass region, and wherein at least one of S/D sections for the pass regions and S/D sections for the pull-down regions includes differentiated epitaxial dopant amounts between the S/D sections for the pass regions and S/D sections for the pull-down regions.

6. The memory circuit of claim 5, wherein at least one of the pull-down and access devices includes a non-planar configuration.

7. A computing system, comprising:
   a die including a static random-access memory circuit, comprising:
      at least one access device including source and drain (S/D) sections for a pass region;
      at least one pull-up device; and
      at least one pull-down device including S/D sections for a pull-down region,
   wherein external resistivity ($R_{ext}$) for the pull-down region is lower than $R_{ext}$ for the pass region, and wherein at least one of S/D sections for the pass regions and S/D sections for the pull-down regions includes differentiated epitaxial dopant amounts between the S/D sections for the pass regions and S/D sections for the pull-down regions; and
   external memory coupled to the microelectronic die.

8. The computing system of claim 7, wherein the computing system is part of one of a cellular telephone, a pager, a portable computer, a desktop computer, and a two-way radio.

9. A static random-access memory circuit, comprising:
   at least one access device including source and drain (S/D) sections for a pass region;
   at least one pull-up device; and
   at least one pull-down device including S/D sections for a pull-down region, wherein external resistivity ($R_{ext}$) for the pull-down region is lower than $R_{ext}$ for the pass region, and wherein at least one of S/D sections for the pass regions and S/D sections for the pull-down regions includes both differentiated epitaxial dopant amounts and differentiated epitaxial volumetric amounts between the S/D sections for the pass regions and S/D sections for the pull-down regions.

10. The memory circuit of claim 9, wherein at least one of the pull-down and access devices includes a non-planar configuration.

11. A computing system, comprising:
   a die including a static random-access memory circuit, comprising:
      at least one access device including source and drain (S/D) sections for a pass region;
      at least one pull-up device; and at least one pull-down device including S/D sections for a pull-down region, wherein external resistivity ($R_{ext}$) for the pull-down region is lower than $R_{ext}$ for the pass region, and wherein at least one of S/D sections for the pass regions and S/D sections for the pull-down regions includes both differentiated epitaxial dopant amounts and differentiated epitaxial volumetric amounts between the S/D sections for the pass regions and S/D sections for the pull-down regions; and external memory coupled to the microelectronic die.

12. The computing system of claim 11, wherein the computing system is part of one of a cellular telephone, a pager, a portable computer, a desktop computer, and a two-way radio.

* * * * *